US011233481B2

(12) United States Patent
Khlat et al.

(10) Patent No.: US 11,233,481 B2
(45) Date of Patent: Jan. 25, 2022

(54) MODULATED POWER APPARATUS

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 25 days.

(21) Appl. No.: 16/775,554

(22) Filed: Jan. 29, 2020

(65) Prior Publication Data

US 2020/0266766 A1 Aug. 20, 2020

Related U.S. Application Data

(60) Provisional application No. 62/807,095, filed on Feb. 18, 2019.

(51) Int. Cl.
*H03G 3/20* (2006.01)
*H03F 1/02* (2006.01)
(Continued)

(52) U.S. Cl.
CPC ............. *H03F 1/0238* (2013.01); *H03F 3/20* (2013.01); *H03F 2200/102* (2013.01);
(Continued)

(58) Field of Classification Search
CPC ...... H03F 1/0227; H03F 1/0238; H03F 1/025; H03F 1/0255
(Continued)

(56) References Cited

U.S. PATENT DOCUMENTS 5,510,753 A 4/1996 French
5,838,732 A 11/1998 Carney
(Continued)

FOREIGN PATENT DOCUMENTS

EP 3174199 A2 5/2017

OTHER PUBLICATIONS

Notice of Allowance for U.S. Appl. No. 16/122,611, dated Jan. 13, 2021, 8 pages.
(Continued)

*Primary Examiner* — Steven J Mottola
(74) *Attorney, Agent, or Firm* — Withrow & Terranova, P.L.L.C.

(57) ABSTRACT

An apparatus that includes a tracking amplifier having an amplifier output terminal coupled to an output voltage node and an envelope input terminal configured to receive an envelope signal of a radio frequency signal is disclosed. A multi-level voltage converter has a switched voltage terminal coupled to the output voltage node and a converter control input terminal configured to receive a converter control signal. A control signal multiplexer has a converter control output terminal coupled to the converter control input terminal, a first converter signal input terminal configured to receive a first converter control signal corresponding to a lower envelope modulation bandwidth, a second converter signal input terminal configured to receive a second converter control signal corresponding to a higher envelope modulation bandwidth, and a converter control signal selector terminal configured to receive a control selector signal for selecting between the first and second converter control signals.

19 Claims, 3 Drawing Sheets

(51) Int. Cl.
*H03F 3/20* (2006.01)
*H04W 52/02* (2009.01)

(52) U.S. Cl.
CPC .. *H03F 2200/111* (2013.01); *H03F 2200/451* (2013.01); *H04W 52/0235* (2013.01)

(58) Field of Classification Search
USPC .................................................. 330/127, 136
See application file for complete search history.

(56) References Cited

U.S. PATENT DOCUMENTS

| | | |
|---|---|---|
| 6,107,862 A | 8/2000 | Mukainakano et al. |
| 6,141,377 A | 10/2000 | Sharper et al. |
| 6,141,541 A | 10/2000 | Midya et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 10,879,804 B2 | 12/2020 | Kim et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1* | 12/2014 | Strange ............... H03F 1/0238 330/297 |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |

(56) References Cited

U.S. PATENT DOCUMENTS

| | | |
|---|---|---|
| 2016/0294587 A1 | 10/2016 | Jiang et al. |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2021/0159590 A1 | 5/2021 | Na et al. |
| 2021/0194515 A1 | 6/2021 | Go et al. |

OTHER PUBLICATIONS

Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Final Office Action for U.S. Appl. No. 16/122,611, dated Sep. 18, 2020, 17 pages.
Notice of Allowance for U.S. Appl. No. 16/246,859, dated Sep. 18, 2020, 8 pages.
Quayle Action for U.S. Appl. No. 16/421,905, dated Aug. 25, 2020, 5 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.

(56) References Cited

OTHER PUBLICATIONS

Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Notice of Allowance for U.S. Appl. No. 16/834,049, dated Jun. 24, 2021, 8 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.

\* cited by examiner

MODULATED POWER APPARATUS

RELATED APPLICATIONS

This application claims the benefit of provisional patent application Ser. No. 62/807,095, filed Feb. 18, 2019, the disclosure of which is hereby incorporated herein by reference in its entirety.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires a higher data rate offered by wireless communication technologies, such as Long-Term Evolution (LTE). To achieve the higher data rate in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking and average power tracking are power management technologies designed to improve efficiency levels of the power amplifiers to help reduce power consumption and thermal dissipation in mobile communication devices. Envelope tracking employs a system that keeps track of the amplitude envelope of the RF signals communicated by mobile communication devices. The envelope tracking system constantly adjusts supply voltage applied to the power amplifiers to ensure that the RF power amplifiers are operating at a higher efficiency for a given instantaneous output power requirement of the RF signals. In this regard, efficiency of the envelope tracking system can affect overall power consumption and performance of the mobile communication devices. In contrast, average power tracking adjusts supply voltage for RF power amplifiers in accordance with transmitter output power.

While average power tracking has a relatively low modulation bandwidth requirement, envelope tracking requirements for modern LTE wireless devices demand relatively wider power supply modulation bandwidth. As such, there is a need for a modulation power management apparatus that provides for varied power supply modulation bandwidth requirements.

SUMMARY

Disclosed is an apparatus including a tracking amplifier having an amplifier output terminal and a feedback input terminal that are both coupled to an output voltage node and an envelope input terminal configured to receive an envelope signal of a radio frequency signal. The apparatus further includes a multi-level voltage converter having a switched voltage terminal coupled to the output voltage node and a converter control input terminal configured to receive a converter control signal. The multi-level voltage converter is configured to receive a battery voltage and generate a switching voltage at the switched voltage terminal in response to the converter signal. Also included is a control signal multiplexer having a converter control output terminal coupled to the converter control input terminal, a first converter signal input terminal configured to receive a first converter control signal corresponding to a lower envelope modulation bandwidth that is below a modulation bandwidth threshold, a second converter signal input terminal configured to receive a second converter control signal corresponding to a higher envelope modulation bandwidth that is above the modulation bandwidth threshold, and a converter control signal selector terminal configured to receive a control signal selector signal for selecting between the first converter control signal and the second converter control signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
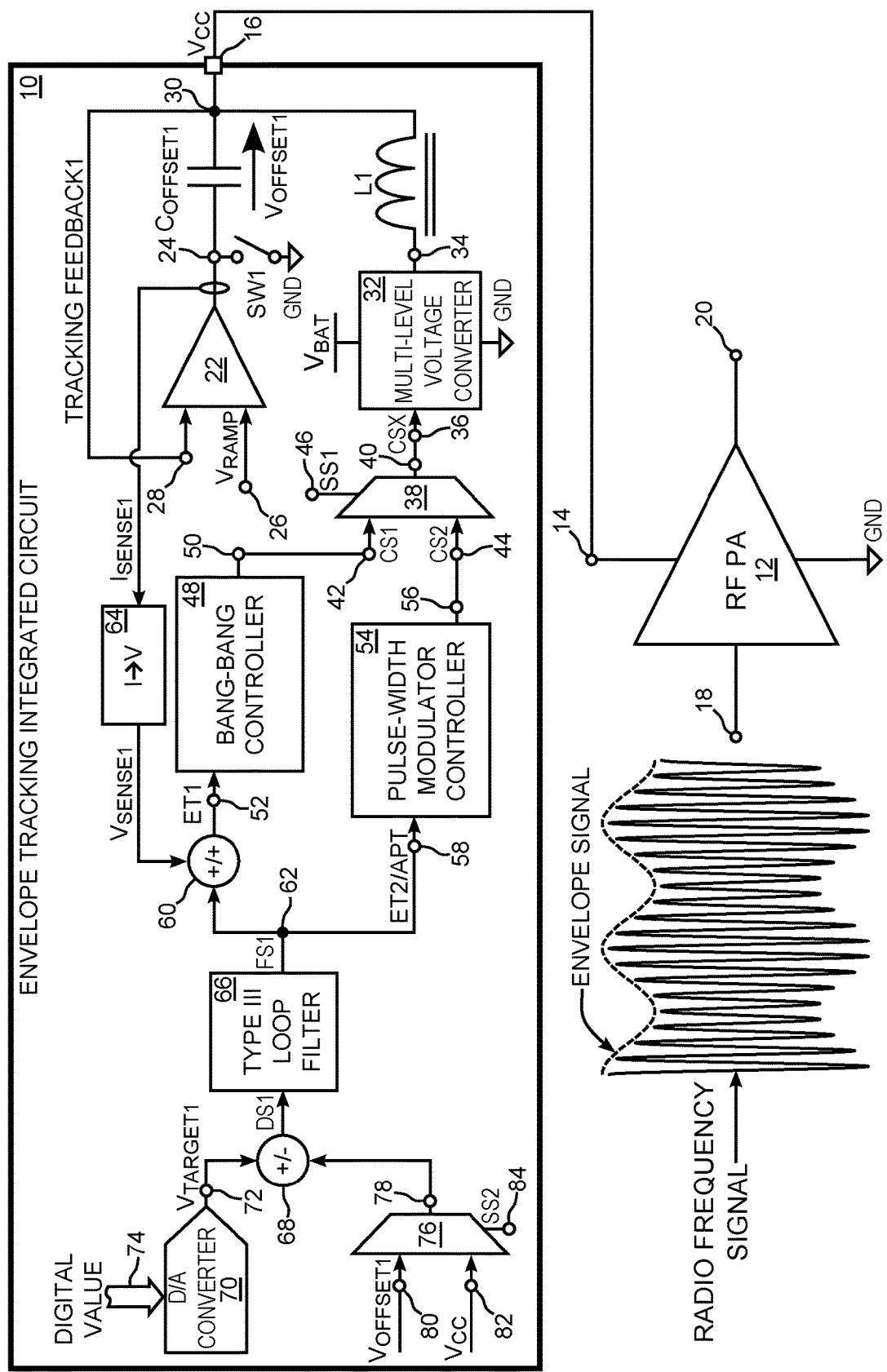
FIG. 1 is a schematic of a first embodiment of a power modulation apparatus in the form of an envelope tracking integrated circuit that is configured to supply modulated power to a load such as a radio frequency power amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of a first embodiment of a power modulation apparatus in the form of an envelope tracking integrated circuit (ETIC) 10 that is configured to supply modulated power to a load such as a radio frequency power amplifier 12. Power to operate the radio frequency power amplifier 12 is supplied through a power supply terminal 14 that is coupled to a supply voltage output terminal 16 of the ETIC 10.

During operation, a radio frequency signal such as depicted as a modulated sinusoid in FIG. 1 is applied to an RF input terminal 18 of the radio frequency power amplifier 12. The radio frequency power amplifier 12 amplifies the radio frequency signal that is output from an RF output terminal 20.

In order for the radio frequency power amplifier to operate efficiently, a supply voltage $V_{CC}$ is modulated by the ETIC 10, which in exemplary embodiments has three modes of supply voltage modulation during operation. A first mode is a first envelope tracking mode (ET1) that is associated with a lower modulation bandwidth that is below a predetermined modulation bandwidth threshold. A second mode is a second envelope tracking mode (ET2) that is associated with a higher modulation bandwidth that is above the predetermined modulation bandwidth threshold. A third mode is an average power tracking mode (APT) that modulates the supply voltage $V_{CC}$ as a function of average RF signal power. The APT mode is typically used when the RF signal being amplified has a relatively lower peak-to-average power ratio in comparison to a relatively higher peak-to-average power ratio of the RF signal duration operation of either the first envelope tracking mode ET1 or the second envelope tracking mode ET2.

As depicted in FIG. 1, an envelope signal derived from the radio frequency signal is shown as a dashed line sinusoid that follows modulation of the radio frequency signal. When operating in either the first envelope tracking mode ET1 or the second envelope tracking mode ET2, the ETIC 10 is configured to modulate the supply voltage $V_{CC}$ by tracking the envelope signal.

In this regard, the ETIC 10 includes a tracking amplifier 22 having a tracking output terminal 24 and a feedback input terminal 28 that are both coupled to an output voltage node 30, which in turn is coupled to the supply voltage output terminal 16. The feedback input terminal 28 is configured to receive a tracking feedback signal that follows the modulation of the supply voltage $V_{CC}$. In some instances, the tracking feedback may be filtered before reaching the feedback input terminal 28.

An offset capacitor $C_{OFFSET1}$ is coupled between the tracking output terminal 24 and the output voltage node 30 to provide an offset voltage that sums with an output voltage at the output voltage node 30. A ground switch SW1 is coupled between the tracking output terminal 24 and ground GND to repurpose the offset capacitor $C_{OFFSET1}$ as a filter capacitor by selectively grounding a plate of the offset capacitor $C_{OFFSET1}$ coupled to the tracking output terminal 24 when the ETIC 10 operates in APT mode.

The tracking amplifier 22 further includes an envelope input terminal 26 that is configured to receive the envelope signal of a radio frequency signal. It is to be understood that the envelope signal may be processed by various filters such as an anti-aliasing filter before being input into the envelope input terminal 26. In some related-art disclosures, an envelope signal is referred to a $V_{RAMP}$ signal. It is to be understood that the envelope signal $V_{RAMP}$ may be processed by an adaptive frequency equalizer (not shown) to compensate for impedance-induced tracking errors and to undergo anti-alias filtering before arriving at the envelope input terminal 26.

The ETIC 10 also includes a multi-level voltage converter 32 having a switched voltage terminal 34 coupled to the output voltage node 30 and a converter control input terminal 36 configured to receive converter control signals CSX. In this exemplary embodiment, the multi-level voltage converter 32 is configured to receive a battery voltage $V_{BAT}$ and generate a switching voltage at the switched voltage terminal 34 in response to the converter control signals CSX. An inductor L1 is coupled between the switched voltage terminal 34 and the output voltage node 30, wherein the inductor L1 is configured to filter higher frequency components from the switching voltage.

The ETIC 10 further includes a control signal multiplexer 38 having a converter control output terminal 40 coupled to the converter control input terminal 36. A first converter signal input terminal 42 of the control signal multiplexer 38 is configured to receive a first converter control signal CS1 corresponding to a lower envelope modulation bandwidth that is below a modulation bandwidth threshold. A second converter signal input terminal 44 is configured to receive a second converter control signal CS2 corresponding to a higher envelope modulation bandwidth that is above the modulation bandwidth threshold. A converter control signal selector terminal 46 is configured to receive a control signal selector signal SS1 for selecting between the first converter control signal CS1 and the second converter control signal CS2.

A first converter controller 48 generates the first converter control signal CS1. The first converter controller 48 has a first converter signal output terminal 50 coupled to the first converter signal input terminal 42. The first converter controller 48 has a first mode feedback terminal 52 that is configured to receive an ET1 feedback signal when the ETIC 10 is operating in the first envelope tracking mode ET1.

In the exemplary embodiment of FIG. 1, the first converter controller 48 is a bang-bang type controller. As such, the first converter control signal CS1 relatively abruptly oscillates between opposing sides of a deadband of a setpoint received at the first mode feedback terminal 52. Bang-bang type control in some instances of envelope tracking may be preferred at lower envelope modulation bandwidth that is below a predetermined modulation bandwidth threshold that may be, for example, 10 MHz. However, at higher envelope modulation bandwidth above, for example, 20 MHz, a different type of controller is needed to maintain efficiency provided by envelope tracking.

In this regard, simulations and experiments conducted for the present disclosure have shown that a pulse-width modulation (PWM) type controller configured for APT may be reused for the second envelope tracking mode ET2. Thus, in the exemplary embodiment of FIG. 1, a second converter controller 54 is configured as a PWM type controller that generates the second converter control signal CS2. The second converter controller 54 has a second converter signal output terminal 56 coupled to the second converter signal input terminal 44. The second converter controller 54 has a second mode feedback terminal 58 that is configured to receive feedback when the ETIC 10 is operating in one of the second envelope tracking mode ET2 and the APT mode.

Returning to the operation of the first converter controller 48, the ET1 feedback signal is a summation of a filtered signal FS1 and a voltage sense signal $V_{SENSE1}$ that are added together at a first summation node 60 located between a first filter output node 62 and the first mode feedback terminal 52. The voltage sense signal $V_{SENSE1}$ is proportional to a current sense signal $I_{SENSE1}$ that is proportional to current flowing through the tracking output terminal 24. A current-to-voltage converter 64 coupled between the tracking output terminal 24 and the first summation node 60 is configured to convert the current sense signal $I_{SENSE1}$ into the voltage sense signal $V_{SENSE1}$.

The filtered signal FS1 is output by a type III loop filter 66 that is coupled between the first filter output node 62 and an output of a second summation node 68. The second summation node 68 outputs a first difference signal DS1 between a target voltage $V_{TARGET1}$ and either an offset voltage $V_{OFFSET1}$, when the ETIC 10 is operating in the envelope tracking modes ET1 or ET2, or the supply voltage $V_{CC}$ when the ETIC 10 is operating in APT mode. The target voltage $V_{TARGET1}$ is generated by a digital-to-analog converter 70 having an analog output terminal 72 coupled to a first input of the second summation node 68 and a digital input 74 that is configured to receive a digital value from an external processor such as a baseband digital processor (not shown). The target voltage $V_{TARGET1}$ is an analog voltage representation of a digital value received at the digital input 74. A type III loop filter is defined as having three poles and two zeros, wherein one of the three poles is at the origin of a pole zero map.

A feedback signal multiplexer 76 has a feedback output terminal 78 coupled to a second input of the second summation node 68. A first feedback signal input terminal 80 of the feedback signal multiplexer 76 is configured to receive the offset voltage $V_{OFFSET1}$, which is the voltage across the offset capacitor $C_{OFFSET1}$ when the ETIC 10 is operating in either of the envelope tracking modes ET1 or ET2. A second feedback signal input terminal 82 is configured to receive the supply voltage $V_{CC}$ to use as feedback when the ETIC 10 is operating in APT mode. A feedback signal selector terminal 84 is configured to receive a feedback signal selector signal SS2 for selecting between the offset voltage $V_{OFFSET1}$ used as feedback for the envelope tracking modes ET1 and ET2 and the supply voltage $V_{CC}$ used as feedback when the ETIC 10 is operating in APT mode.

Figure 2:
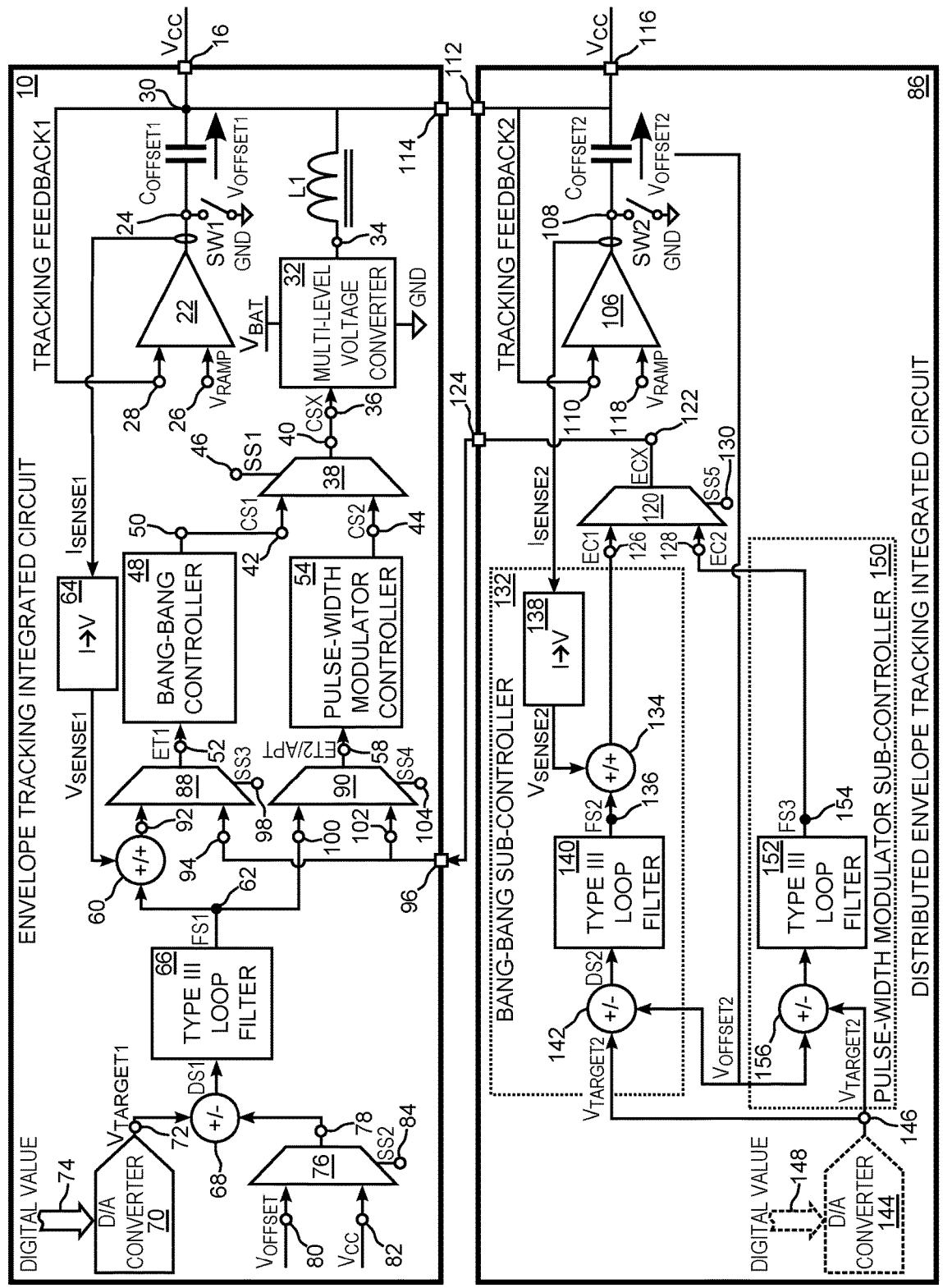
FIG. 2 is a schematic of a second embodiment of a power modulation apparatus in the form of a modified version of the envelope tracking integrated circuit of FIG. 1 and a distributed envelope tracking integrated circuit that is further configured to supply modulated power to a load such as a radio frequency power amplifier.

FIG. 2 is a schematic of a second embodiment of a power modulation apparatus in the form of a modified version of the ETIC 10 of FIG. 1 and a distributed envelope tracking integrated circuit (DETIC) 86 that is further configured to supply modulated power to a load such as the radio frequency power amplifier 12 (FIG. 1). In this second exemplary embodiment, the ETIC 10 is modified to include a first controller multiplexer 88 that is configured to select between a first internal control signal generated internally by ETIC 10 and a first external control signal that is generated externally of the ETIC 10 by the DETIC 86. The ETIC 10 is further modified to include a second controller multiplexer 90 that is configured to select between a second internal control signal generated internally by ETIC 10 and a second external control signal that is generated externally of the ETIC 10 by the DETIC 86.

The first controller multiplexer 88 has a first internal signal terminal 92 coupled to the output of the first summation node 60 and a first external signal terminal 94 coupled to an external control signal input terminal 96. A first controller signal selector terminal 98 is configured to receive a first controller signal selector signal SS3 for selecting between a first internal control signal and a first external control signal.

Moreover, the second controller multiplexer 90 has a second internal signal terminal 100 coupled to the first filter output node 62 and a second external signal terminal 102 coupled to the external control signal input terminal 96. A second controller signal selector terminal 104 is configured to receive a second controller signal selector signal SS4 for selecting between a second internal control signal and a second external control signal.

The DETIC 86 includes a second tracking amplifier 106 having a second tracking output terminal 108 and a second feedback input terminal 110 that are both coupled to the output voltage node 30 by way of a first node coupling terminal 112 of the DETIC 86 and a second node coupling terminal 114 of the ETIC 10. The second tracking output terminal 108 and the second feedback input terminal 110 are also coupled to a second supply voltage output terminal 116. The second feedback input terminal 110 is configured to receive a second tracking feedback signal that follows the modulation of the supply voltage $V_{CC}$. In some instances, the second tracking feedback may be filtered before reaching the second feedback input terminal 110.

A second offset capacitor $C_{OFFSET2}$ is coupled between the second tracking output terminal 108 and the second supply voltage output terminal 116 to provide a second offset voltage $V_{OFFSET2}$ that sums with the output voltage at the output voltage node 30. A second ground switch SW2 is coupled between the second tracking output terminal 108 and ground GND to repurpose the second offset capacitor $C_{OFFSET2}$ as a second filter capacitor in parallel with offset capacitor $C_{OFFSET1}$ in the ETIC 10 by selectively grounding a plate of the second offset capacitor $C_{OFFSET2}$ when the ETIC 10 operates in APT mode.

The second tracking amplifier 106 further includes a second envelope input terminal 118 that is configured to receive the envelope signal of the radio frequency signal (FIG. 1). It is to be understood that the envelope signal may be processed by various filters such as an anti-aliasing filter before being input into the second envelope input terminal 118. It is to be understood that the envelope signal $V_{RAMP}$ may be processed by an adaptive frequency equalizer (not shown) to compensate for impedance-induced tracking errors and undergo anti-alias filtering before arriving at the second envelope input terminal 118.

The DETIC 86 further includes an external control signal multiplexer 120 having an external control output terminal 122 coupled to an external control output terminal 124, which in turn is coupled to the external control signal input terminal 96 of the ETIC 10. A first external control signal terminal 126 of the external control signal multiplexer 120 is configured to receive a first external control signal EC1 corresponding to the lower envelope modulation bandwidth that is below the modulation bandwidth threshold. A second external control signal terminal 128 is configured to receive a second external control signal EC2 corresponding to the higher envelope modulation bandwidth that is above the modulation bandwidth threshold. An external control signal selector terminal 130 is configured to receive a control signal selector signal SS5 for selecting between the first external control signal EC1 and the second external control signal EC2.

The DETIC 86 also includes a first sub-controller 132 that is configured to generate the first external control signal EC1 that is selectably routable to the first converter controller 48 of ETIC 10. In the exemplary embodiment of FIG. 2, the first converter controller 48 of ETIC 10 remains a bang-bang type controller. As such, the first sub-controller 132 in the exemplary embodiment of FIG. 2 is referred to as a bang-bang sub-controller. The first sub-controller 132 differs from the first converter controller 48 in that the first sub-controller 132 is not configured to directly control the multi-level voltage converter 32. Instead, the first external control signal EC1 is selectably routable to the first mode feedback terminal 52 to become the first mode ET1 feedback signal to drive the first converter controller 48.

The first external control signal EC1 is a summation of a second filtered signal FS2 and a second voltage sense signal $V_{SENSE2}$ that are added together at a third summation node 134 located between a second filter output node 136 and the first external control signal terminal 126. The second voltage sense signal $V_{SENSE2}$ is proportional to a second current sense signal $I_{SENSE2}$ that is proportional to current flowing through the second tracking output terminal 108. A current-to-voltage converter 138 coupled between the second tracking output terminal 108 and the third summation node 134 is configured to convert the second current sense signal $I_{SENSE2}$ into the second voltage sense signal $V_{SENSE2}$.

The second filtered signal FS2 is output by a second type III loop filter 140 that is coupled between the second filter output node 136 and an output of a fourth summation node 142. The fourth summation node 142 outputs a second difference signal DS2 between a second target voltage $V_{TARGET2}$ and the second offset voltage $V_{OFFSET2}$, when the DETIC 86 is operating in the first envelope tracking mode ET1. The second target voltage $V_{TARGET2}$ is generated by a second digital-to-analog converter 144 having an analog output terminal 146 coupled to a first input of the fourth summation node 142 and a second digital input 148 that is configured to receive a digital value from an external processor such as a baseband digital processor (not shown). The second target voltage $V_{TARGET2}$ is an analog voltage representation of a digital value received at the second digital input 148. The second digital-to-analog converter 144 is shown in dashed line to highlight that the second digital-to-analog converter 144 may be replaced by reusing the digital-to-analog converter 70 to generate the second target voltage $V_{TARGET2}$.

The DETIC 86 further includes a second sub-controller 150 that is configured to generate the second external control signal EC2 that is selectably routable to the second converter controller 54 of the ETIC 10. In the exemplary embodiment of FIG. 2, the second converter controller 54 of the ETIC 10 remains a pulse-width modulator type controller. As such, the second sub-controller 150 in the exemplary embodiment of FIG. 2 is referred to as a pulse-width modulation sub-controller. The second sub-controller 150 differs from the second converter controller 54 in that the second sub-controller 150 is not configured to directly control the multi-level voltage converter 32. Instead, the second external control signal EC2 is selectably routable to the second mode feedback terminal 58 to become the second mode ET2 feedback signal to drive the second converter controller 54.

A third filtered signal FS3 is output by a third type III loop filter 152 that is coupled between a third filter output node 154 and an output of a fifth summation node 156. The fourth summation node 142 outputs the second difference signal DS2 between the second target voltage $V_{TARGET2}$ and the second offset voltage $V_{OFFSET2}$, when the DETIC 86 is operating in the first envelope tracking mode ET1.

Figure 3:
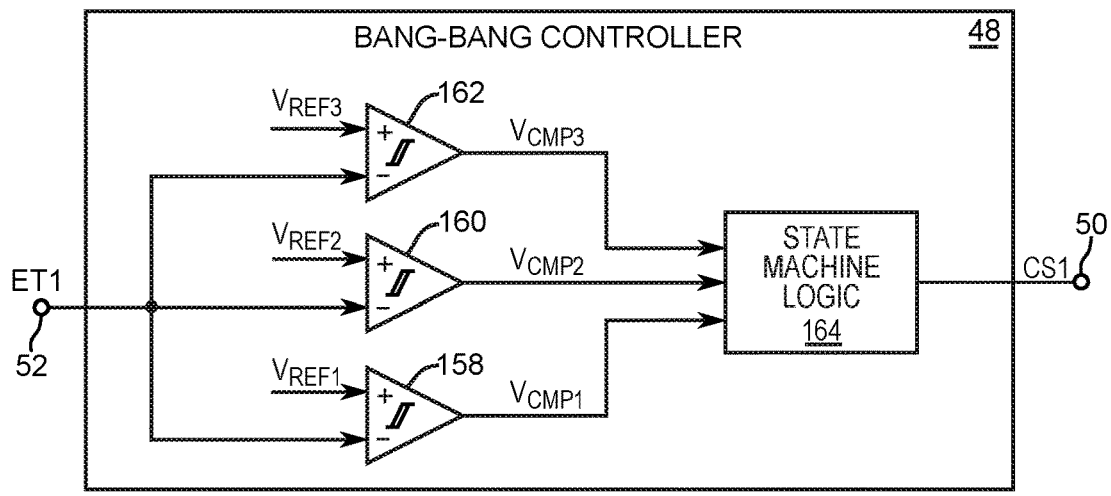
FIG. 3 is a simplified schematic of the first controller, which is a bang-bang type controller in exemplary embodiments.

FIG. 3 is a simplified schematic of the first converter controller 48, which is a bang-bang type controller in exemplary embodiments. In this regard, the first converter controller 48 includes a first threshold comparator 158, a second threshold comparator 160, and a third threshold comparator 162 that are configured to compare the first mode ET1 signal to a first reference voltage $V_{REF1}$, a second reference voltage $V_{REF2}$, and a third reference voltage $V_{REF3}$, respectively.

State machine logic 164 receives voltage signal levels $V_{CMP1}$, $V_{CMP2}$, and $V_{CMP3}$ that are generated by the first threshold comparator 158, the second threshold comparator 160, and the third threshold comparator 162, respectively. The state machine logic 164 is configured to generate the first converter control signal CS1 based upon the respective $V_{CMP1}$, $V_{CMP2}$, and $V_{CMP3}$ voltage signal levels and a present state that may be one of a buck state, a boost state, a battery state, and a ground state of the multi-level voltage converter 32. The state machine logic 164 may be implemented, for example, by conventional logic cells and/or a field programmable gate array.

Figure 4:
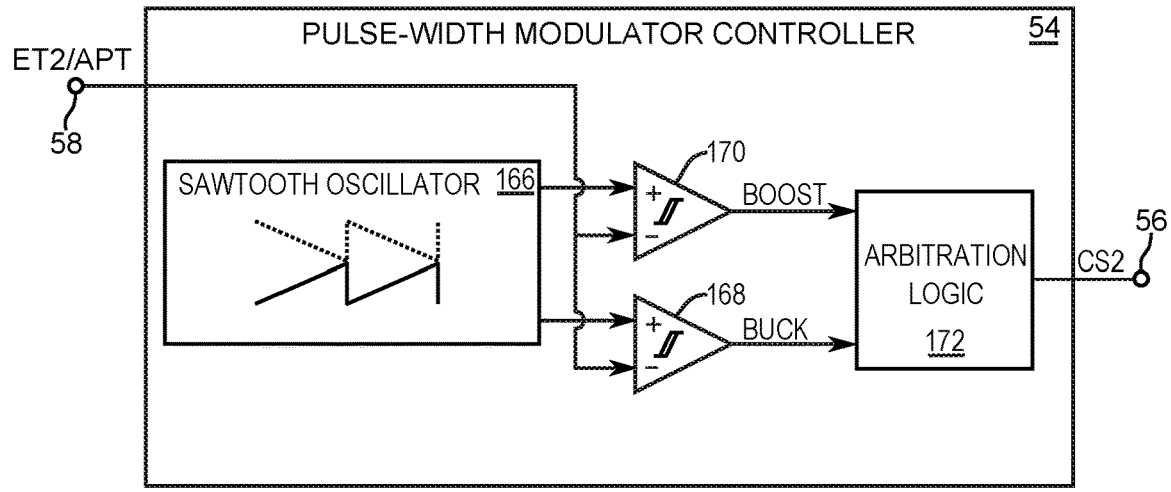
FIG. 4 is a simplified schematic of the second converter controller, which is a pulse-width modulator type controller in exemplary embodiments.

FIG. 4 is a simplified schematic of the second converter controller 54, which is a pulse-width modulator type controller in exemplary embodiments. The second converter controller 54 includes a sawtooth oscillator 166 that generates a positively sloping sawtooth wave shown in solid line and a negatively sloping sawtooth wave shown in dashed line.

A fourth threshold comparator 168 is configured to compare the positively sloping sawtooth with the second mode ET2 feedback signal when the ETIC 10 is operating in the second envelope tracking mode ET2 that is associated with a higher modulation bandwidth that is above the predetermined modulation bandwidth threshold. The fourth threshold comparator 168 is configured to output a buck control signal that is associated with buck operation of the multi-level voltage converter 32.

A fifth threshold comparator 170 is configured to compare the negatively sloping sawtooth with the second mode ET2 feedback signal when the ETIC 10 is operating in the second envelope tracking mode ET2 that is associated with a higher modulation bandwidth that is above the predetermined modulation bandwidth threshold. The fifth threshold comparator 170 is configured to output a boost control signal that is associated with boost operation of the multi-level voltage converter 32. Arbitration logic 172 is configured to pass the buck and boost control signals through the second converter signal output terminal 56 depending upon which of buck or boost is needed for a particular state of the multi-level voltage converter 32.

Figure 5:
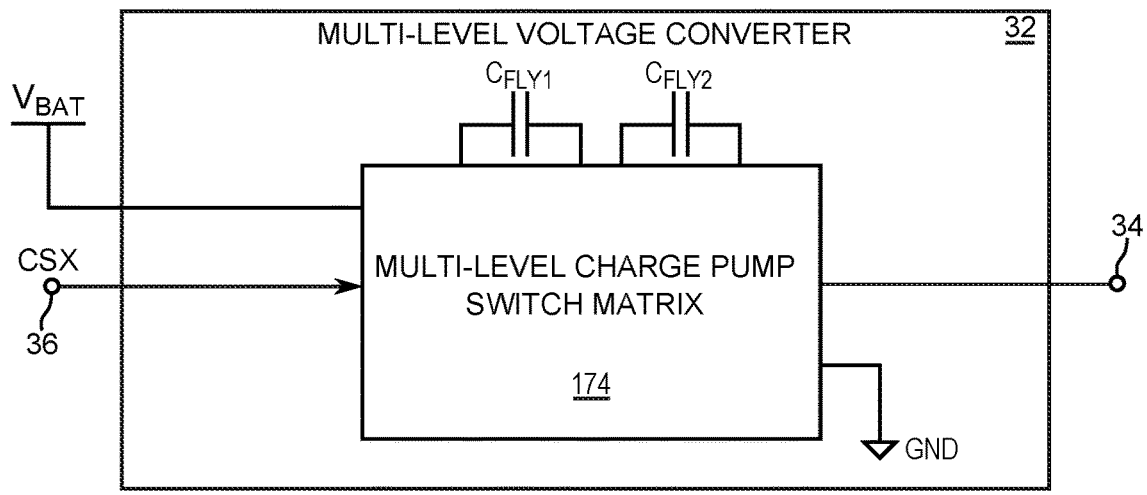
FIG. 5 is a simplified schematic of the multi-level voltage converter, which in exemplary embodiments is of the multi-level charge pump type.

FIG. 5 is a simplified schematic of the multi-level voltage converter 32, which in exemplary embodiments is of the multi-level charge pump type. In particular, the multi-level voltage converter 32 includes a multi-level charge pump switch matrix 174 that is coupled between the battery voltage $V_{BAT}$ and ground GND. Further included are a first flying capacitor $C_{FLY1}$ and a second flying capacitor $C_{FLY2}$ that are coupled to the multi-level charge pump switch matrix 174. The multi-level charge pump switch matrix 174 is configured to selectively couple the first flying capacitor $C_{FLY1}$ and the second flying capacitor $C_{FLY2}$ in various arrangements between the battery voltage $V_{BAT}$ and ground GND to selectively buck or boost the battery voltage $V_{BAT}$ depending upon the converter control signals CSX applied to the converter control input terminal 36.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a tracking amplifier having a tracking output terminal and a feedback input terminal that are both coupled to an output voltage node and an envelope input terminal configured to receive an envelope signal of a radio frequency signal;
a multi-level voltage converter having a switched voltage terminal coupled to the output voltage node and a converter control input terminal configured to receive converter control signals;
a control signal multiplexer having a converter control output terminal coupled to the converter control input terminal, a first converter signal input terminal configured to receive a first one of the converter control signals corresponding to a lower envelope modulation bandwidth that is below a modulation bandwidth threshold, a second converter signal input terminal configured to receive a second one of the converter control signals corresponding to a higher envelope modulation bandwidth that is above the modulation bandwidth threshold, and a converter control signal selector terminal configured to receive a control signal selector signal for selecting between the first one of the converter control signals and the second one of the converter control signals;
a first converter controller configured to generate the first one of the converter control signals during a first envelope tracking mode corresponding to the lower envelope modulation bandwidth that is below the modulation bandwidth threshold; and
a second converter controller configured to generate the second one of the converter control signals during a second envelope tracking mode corresponding to the higher envelope modulation bandwidth that is above the modulation bandwidth threshold.

2. The apparatus of claim 1 wherein the second converter controller is configured to generate a third one of the converter control signals during an average power tracking mode.

3. The apparatus of claim 1 wherein the first converter controller is a bang-bang type controller.

4. The apparatus of claim 1 wherein the second converter controller is a pulse-width modulation type controller.

5. The apparatus of claim 1 wherein the first converter controller is a bang-bang type controller and the second converter controller is a pulse-width modulation type converter.

6. The apparatus of claim 1 further comprising a current-to-voltage converter coupled between the tracking output terminal of the tracking amplifier and a first summation node having an output coupled to a first mode feedback terminal of the first converter controller, wherein the current-to-voltage converter is configured to convert a current sense signal that is proportional to current flowing through the tracking output terminal into a voltage sense signal.

7. The apparatus of claim 6 further including a loop filter coupled between the first summation node and an output of a second summation node, wherein the loop filter is configured to output a filtered version of a first difference signal generated at the output of the second summation node.

8. The apparatus of claim 7 wherein a first envelope tracking feedback signal output to the first converter controller is a summation of the voltage sense signal and the filtered version of the first difference signal.

9. The apparatus of claim 7 wherein the second converter controller is configured to receive the filtered version of the first difference signal and generate the second one of the converter control signals during the second envelope tracking mode.

10. The apparatus of claim 9 further comprising an offset capacitor coupled between the tracking output terminal and the output voltage node to provide an offset voltage that sums with an output voltage at the output voltage node.

11. The apparatus of claim 10 further comprising a ground switch coupled between the tracking output terminal and ground, wherein the ground switch is configured to selectively ground a plate of the offset capacitor coupled to the tracking output terminal when operating in an average power tracking mode.

12. The apparatus of claim 10 further comprising a feedback signal multiplexer having:

a first feedback input terminal configured to receive an offset voltage signal that is proportional to a voltage across the offset capacitor;

a second feedback terminal configured to receive an output voltage signal that is proportional to a supply voltage at the output voltage node;

a feedback selector terminal configured to receive a feedback selection signal that selects the offset voltage signal when operating in either the first envelope tracking mode or the second envelope tracking mode; and a feedback output terminal coupled to an input of the second summation node, wherein a selected one of the offset voltage signal and the output voltage signal is output at the feedback output terminal.

13. The apparatus of claim 12 wherein the feedback selector terminal is further configured to receive a feedback selection signal that selects the output voltage signal when operating in an average power tracking mode.

14. The apparatus of claim 12 wherein the first difference signal that is output to the loop filter is a difference between a target voltage signal and a selected one of the offset voltage signal and the output voltage signal.

15. The apparatus of claim 1 further comprising an inductor coupled between the switched voltage terminal and the output voltage node, wherein the inductor is configured to filter a switching voltage.

16. An apparatus comprising:

a tracking amplifier having a tracking output terminal and a feedback input terminal that are both coupled to an output voltage node and an envelope input terminal configured to receive an envelope signal of a radio frequency signal;

a multi-level voltage converter having a switched voltage terminal coupled to the output voltage node and a converter control input terminal configured to receive converter control signals;

a control signal multiplexer having a converter control output terminal coupled to the converter control input terminal, a first converter signal input terminal configured to receive a first one of the converter control signals corresponding to a lower envelope modulation bandwidth that is below a modulation bandwidth threshold, a second converter signal input terminal configured to receive a second one of the converter control signals corresponding to a higher envelope modulation bandwidth that is above the modulation bandwidth threshold, and a converter control signal selector terminal configured to receive a control signal selector signal for selecting between the first one of the converter control signals and the second one of the converter control signals;

a first controller multiplexer having an output coupled to the first mode feedback terminal of a first converter controller, a first internal signal terminal coupled to the output of the first summation node, a first external signal terminal, and a first controller signal selector terminal configured to receive a first controller signal selector signal for selecting between a first internal control signal and a first external control signal; and a second controller multiplexer having an output coupled to a second mode feedback terminal of a second converter controller, a second internal signal terminal coupled to an input of the first summation node, a second external signal terminal coupled to the first external signal terminal, and a second controller signal selector terminal configured to receive a second controller signal selector signal for selecting between a second internal control signal and a second external control signal.

17. The apparatus of claim 16 wherein the tracking amplifier, the multi-level voltage converter, the control signal multiplexer, the first converter controller, the first controller multiplexer, the second converter controller, and the second controller multiplexer are integrated into an envelope tracking integrated circuit having an external control signal input terminal coupled to the first external signal terminal and the second external signal terminal.

18. The apparatus of claim 17 further comprising:

a second tracking amplifier having a second tracking output terminal and a second feedback input terminal that are both coupled to the output voltage node and a second envelope input terminal configured to receive the envelope signal of the radio frequency signal;

an external control signal multiplexer having an external control output terminal coupled to the external control signal input terminal of the envelope tracking integrated circuit, a first external control signal terminal configured to receive a first one of external converter control signals corresponding to a lower envelope modulation bandwidth that is below a modulation bandwidth threshold, a second external control signal terminal configured to receive a second one of the external converter control signals corresponding to a higher envelope modulation bandwidth that is above the modulation bandwidth threshold, and an external control signal selector terminal configured to receive an external control signal selector signal for selecting between the first one of the external converter control signals and the second one of the external converter control signals;

a first sub-controller configured to receive a tracking feedback signal from the second tracking amplifier and generate the first one of the external converter control signals based upon a second target voltage and the tracking feedback signal; and a second sub-controller configured to receive an offset voltage signal from the second tracking amplifier and generate the second one of the external converter control signals based upon a second target voltage and the offset voltage signal.

19. The apparatus of claim 18 wherein the second tracking amplifier, the external control signal multiplexer, the first sub-controller, and the second sub-controller are integrated into a distributed envelope tracking integrated circuit.

\* \* \* \* \*